US009613947B2

(12) United States Patent
Reed

(10) Patent No.: US 9,613,947 B2
(45) Date of Patent: Apr. 4, 2017

(54) MONOLITHIC MICROWAVE INTEGRATED CIRCUIT (MMIC) CASCODE CONNECTED TRANSISTOR CIRCUIT

(71) Applicant: Raytheon Company, Waltham, MA (US)

(72) Inventor: Thomas B. Reed, North Reading, MA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 14/663,974

(22) Filed: Mar. 20, 2015

(65) Prior Publication Data

US 2016/0276337 A1  Sep. 22, 2016

(51) Int. Cl.
| H01L 27/02 | (2006.01) |
| H01L 27/07 | (2006.01) |
| H01L 29/417 | (2006.01) |
| H03F 1/22 | (2006.01) |
| H03F 3/195 | (2006.01) |
| H03F 3/21 | (2006.01) |

(52) U.S. Cl.
CPC ...... *H01L 27/0266* (2013.01); *H01L 27/0288* (2013.01); *H01L 27/0296* (2013.01); *H01L 27/0733* (2013.01); *H01L 29/41725* (2013.01); *H03F 1/223* (2013.01); *H03F 3/195* (2013.01); *H03F 3/211* (2013.01); *H03F 2200/174* (2013.01); *H03F 2200/315* (2013.01); *H03F 2200/451* (2013.01); *H03F 2200/75* (2013.01)

(58) Field of Classification Search
CPC . H01L 27/02; H01L 27/0266; H01L 27/0296; H01L 29/4238; H01L 29/66659; H01L 29/42328; H01L 29/66484; H01L 27/10823
See application file for complete search history.

(56) References Cited

U.S. PATENT DOCUMENTS

| 4,315,272 A | 2/1982 | Vorhaus |
| 5,519,358 A * | 5/1996 | Tserng ................ H01L 27/0207 257/E27.012 |
| 2003/0011008 A1 | 1/2003 | Nelson |
| 2005/0007200 A1 | 1/2005 | Inoue et al. |

(Continued)

OTHER PUBLICATIONS

Notification of Transmittal of the International Search Report and the Written Opinion of the International Searching Authority, or the Declaration, PCT/US2016/023045, Jun. 27, 2016, 1 page.

(Continued)

*Primary Examiner* — Phuc Dang
(74) *Attorney, Agent, or Firm* — Daly, Crowley, Mofford & Durkee, LLP

(57) ABSTRACT

A cascode transistor circuit having an active region, the active region having a source, a drain, a floating source/drain, a first gate disposed between the source and the floating source/drain and a second gate disposed between the floating source/drain and the drain. A first gate pad is displaced from the active region and is electrically connected to the first gate and a second gate pad is displaced from the active region and is electrically connected to the second gate. The first and the second gate pads are disposed on opposite sides of the active region.

7 Claims, 9 Drawing Sheets

(56) References Cited

U.S. PATENT DOCUMENTS

| | | | |
|---|---|---|---|
| 2009/0212854 A1* | 8/2009 | Baumgartner | H01L 29/4238 327/543 |
| 2010/0213503 A1* | 8/2010 | Yanagihara | H01L 23/481 257/130 |
| 2015/0255847 A1* | 9/2015 | Reza | H01P 1/162 333/238 |

OTHER PUBLICATIONS

International Search Report, PCT/US2016/023045, Jun. 27, 2016, 4 pages.
Written Opinion of the International Searching Authority, PCT/US2016/023045, Jun. 27, 2016, 7 pages.

\* cited by examiner

MONOLITHIC MICROWAVE INTEGRATED CIRCUIT (MMIC) CASCODE CONNECTED TRANSISTOR CIRCUIT

TECHNICAL FIELD

This disclosure relates generally to microwave monolithic integrated circuits (MMICs) and more particularly to MMICs having cascode connected transistors.

BACKGROUND AND SUMMARY

As is known in the art, cascode connected transistor circuit (FIG. 1A) includes a pair of transistors Q1, Q2 arranged as a two-stage amplifier, a common-source transconductance amplifier section formed by one of the transistors Q1 and followed by a common-gate current buffer amplifier section formed by the one of the second transistors Q2. Thus, the cascode is a dual gate device or circuit. A schematic diagram of one such arrangement is shown in FIG. 1A. Here, the transistors Q1, Q2 are Field Effect Transistors (FETs). It is noted that the transconductance amplifier section includes a common (grounded) source (S) FET Q1 having its gate electrode (GATE1) fed by an input signal. The current buffer amplifier section includes a common (grounded) gate (GATE2) FET Q2 having its gate connected to ground through a capacitor (C). The source (S) of the common (grounded) gate (S) FET Q2 and the drain (D) of the common source FET Q1 are connected together to provide a floating source/drain (S/D), as indicated. The amplified input signal is produced as an output signal at the drain (D) of FET Q2.

It is noted it that, in referring to FIG. 1B, a plan view layout of the cascode circuit in an MMIC structure is shown. It is first noted that the source (S) of Q1, the gate GATE 1 of Q1, the floating source/drain (S/D), the gate GATE 2 of Q2 and the drain D of Q2 are all on an active region, where a semiconductor mesa region is formed on the upper surface of the substrate. Thus, the gate GATE 1 of Q1 controls the flow of carriers passing through the active region between the source/drain (S/D) and the source (S) of FET Q1 and the gate of Q2 (GATE 2) controls the flow of carriers passing through the active region between the drain (D) of FET Q2 and the source/drain (S/D). The gate of FET Q1 (GATE 1) is fed by an input microwave transmission line, where, for example, a coplanar waveguide (CPW) transmission line having a center conductor disposed between a pair of ground plane conductors is disposed on an upper surface of a substrate. The center conductor is connected to a gate pad (GATE PAD 1) for GATE 1 of FET Q1. It is noted that the gate pad (GATE PAD 1) is off of (laterally displaced from) the active region. The gate GATE 2 of FET Q2 is connected to a gate pad (GATE PAD 2). It is noted is also noted that: (1) the gate pad (GATE PAD 2) is also off of (laterally displaced from) the active region and (2) both GATE PAD 1 and GATE PAD 2 are on the same side of the active region (here, in this layout, both GATE 1 and GATE 2 are on the left side of the active region). The drain (D) of the FET Q2 is connected to an output microwave transmission line, here also a CPW transmission line having a center conductor disposed between a pair of ground plane conductors. More particularly, the drain (D) is connected to the center conductor of the output CPW transmission line. The gate GATE 2 of FET Q2 is connected to a capacitor disposed on the upper surface of the substrate through the gate pad (GATE PAD 2), and air bridge conductor disposed over the GATE PAD 1 onto the upper plate of the capacitor. The lower plate of the capacitor is separated from the upper plate by a dielectric. The bottom plate is connected to a ground plane conductor of the output CPW transmission line. It is noted that the ground plane conductor of the input CPW and the output CPW may be connected to a ground plane (not shown) on the bottom surface of the substrate with conductive vias, not shown, passing vertically through the substrate.

Another cascode connected transistor circuit is shown in FIG. 2A and a plan view layout of the cascode circuit in an MMIC structure of FIG. 2A is shown in FIG. 2B. Here, the GATE PAD 2 is connected directly to ground and the source (S) is connected to ground through a capacitor.

The inventors have recognized that a long electrical path exits between the GATE 2 of FET Q2 and ground in both the layout of FIGS. 1B and 2B thereby increasing parasitic resistance and inductance on the gate's path to ground decreasing the circuits stability factor and thus effectively lowering Maximum Stable Gain (MSG). The inventors have recognized that this long electrical path exists because both gate pads (GATE PAD 1 and GATE PAD 2) are on the same side of the active region and thus a relatively long air bridge is required to "jump-over" or bridge the first gate pad (GATE PAD 1). This effect is particularly important in small, on the order of 50-nm gate length G-band FETs with both gates having the same lengths and a mesa 20 μm in width.

In accordance with the present disclosure, a cascode transistor circuit is provided having an active region, the active region having a source, a drain, a floating source/drain, a first gate disposed between the source and the floating source/drain and a second gate disposed between the floating source/drain and the drain. A first gate pad is displaced from the active region and is electrically connected to the first gate and a second gate pad is displaced from the active region and is electrically connected to the second gate. The first and the second gate pads are on opposite sides of the active region.

In one embodiment, a cascode transistor circuit is provided having: an input transmission line having a conductor disposed on an upper surface of a substrate; an output transmission line having a conductor disposed on the upper surface of the substrate; a first transistor having a gate electrode disposed on the upper surface of the substrate and connected to the conductor of the input transmission line, for controlling a flow of carriers, in a first portion of an active region of the substrate, between a source region of the substrate and a floating source/drain region of the substrate; a second transistor having a gate electrode disposed on the upper surface of the substrate for controlling a flow of carriers in an active region of the substrate between the floating source/drain region of the substrate and a drain region of the substrate, the drain region being connected to the conductor of the output transmission line; a first gate contact pad, laterally displaced from the active region, and connected to one end of the gate electrode of the first transistor, a second gate contact pad, laterally displaced from the active region, and connected to one end of the gate electrode of the second transistor. The first gate pad and the second gate pad are disposed on opposite sides of the active region. A capacitor is provided having: a lower plate disposed on the upper surface of the substrate; a dielectric disposed on the lower plate; and an upper plate disposed on the dielectric. One of the upper and lower plates is connected to either the source or second gate pad and the other one of the upper plate and lower plates is connected to the ground plane conductor portions of at least one of the input transmission line or the output transmission line.

In one embodiment, the lower plate is connected to either the source or second gate pad and the upper plate is connected is connected to the ground plane conductor portions of at least one of the input transmission line or the output transmission line.

In one embodiment, a cascode transistor circuit arrangement is provided having: a pair of laterally spaced cascode transistor circuits, each one having a corresponding one of a pair of active regions, each one of the pair of active regions being disposed on different portion of a surface of a substrate, each one of the active regions having a source, a drain, a floating source/drain, a first gate disposed between the source and the floating source/drain and a second gate disposed between the floating source/drain and the drain; a common gate pad connected to the first gate of both the cascode transistor circuits and displaced from the active region and between the pair of laterally spaced active regions; a first, second gate pad displaced from a first one of the active regions and electrically connected to the second gate of a first one of the pair of cascode connected transistors; a second, second gate pad displaced from a second one of the active regions and electrically connected to the second gate of a second one of the pair of cascode connected transistors. The common gate pad and the first, second gate pad are on opposite sides of the first one of the active regions and the common gate pad and the second, second gate pad are on opposite sides of the second one of the active regions.

In one embodiment, a common drain pad is connected to the drain of each one of the pair of cascode transistor circuits.

Thus the inventors have recognized that placing the gate pads on opposite sides of the active region simplifies the interconnect complexity. Further such an arrangement allows for parallel cascode devices to share a gate (RF input gate) connection and common drain (RF output) connection. The common connected gate (the ac grounded gate in the cascode) directly connects to the bottom plate of a capacitor that acts as AC ground. This is a major reduction in series inductance to ground versus the previous state-of-the-art which used a long air-bridge connection. A reduction in inductance to ground should increase maximum available gain of the dual gate at the desired frequency and contribute to greater device stability.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 3:
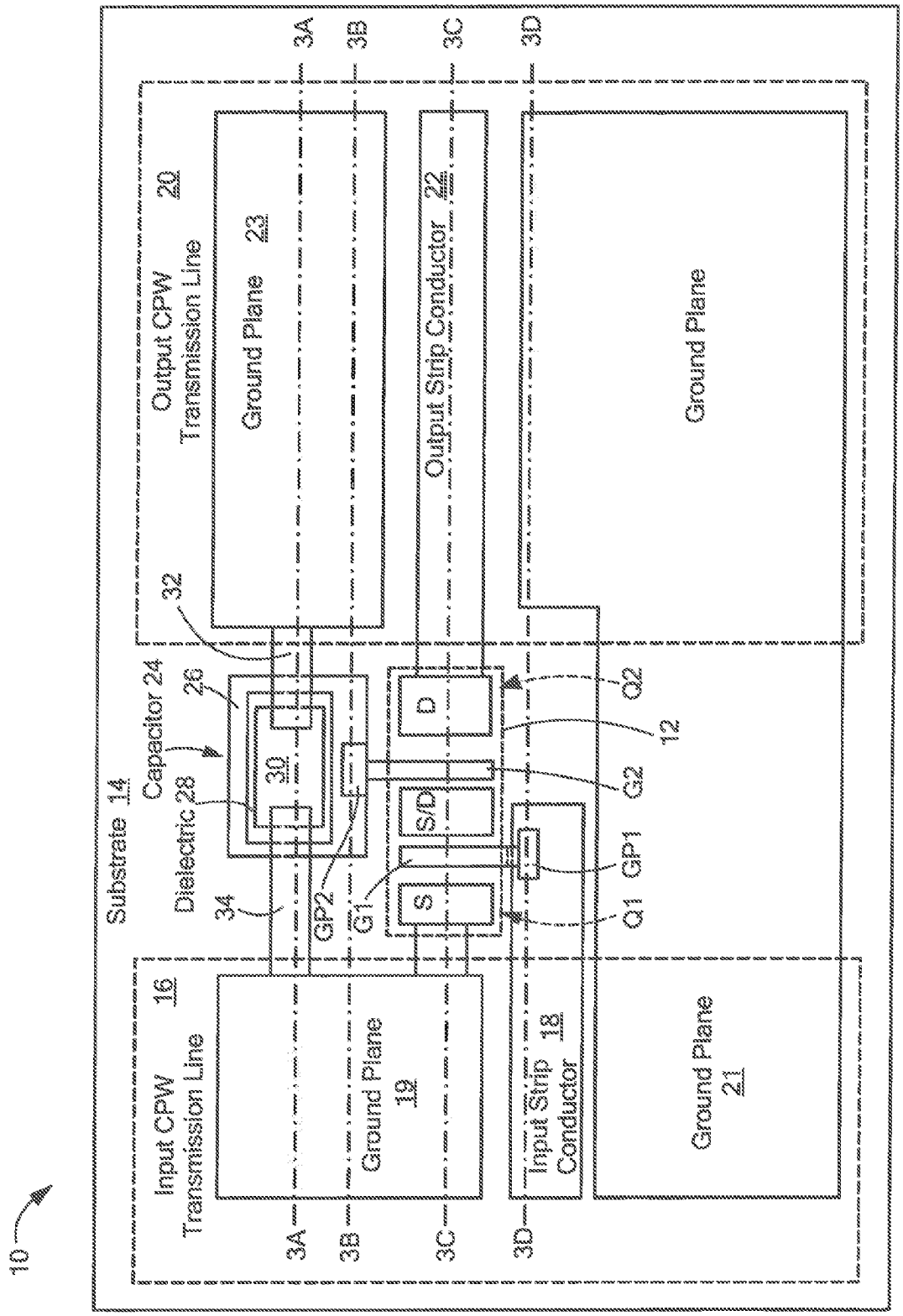
FIG. 3 is a plan view of a top view Monolithic Microwave Integrated Circuit (MMIC) layout of the cascode transistor circuit of FIG. 1 according to the disclosure.

Referring now to FIG. 3, a cascode transistor circuit 10 is shown having an active region 12, the active region 12 having a source (S), a drain (D), a floating source/drain (S/D), a first gate (G1) disposed between the source (S) and the floating source/drain (S/D) and a second gate (G2) disposed between the floating source drain (S/D) and the drain (D). A first gate pad (GP1) is displaced from the active region 12 and is electrically connected to the first gate (G1) and a second gate pad (GP2) is displaced from the active region 12 and is electrically connected to the second gate (G2). The first pad (GP1) and the second gate pad (GP2) are disposed on opposite sides of the active region 12, as shown. Here, in this example, the circuit has a 50-nm gate length (the distance along a direction from the source to the drain) for G-band operation with both gates (G1) and (G2) having the same lengths and wherein the active region 12 is a mesa having a width (a distance along a direction perpendicular to the gate length) of 20 μm.

Figure 3A:
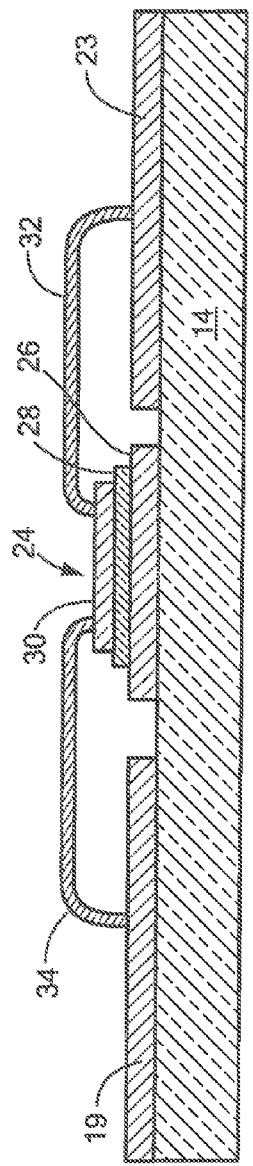
FIGS. 3A through 3D are cross sectional views of the Monolithic Microwave Integrated Circuit (MMIC) layout of the cascode transistor circuit of FIG. 3 taken along lines 3A-3A through 3D-3D, respectively.
Figure 3B:
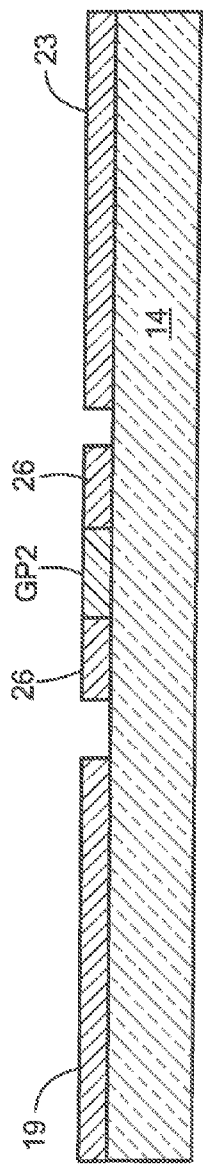
Figure 3C:
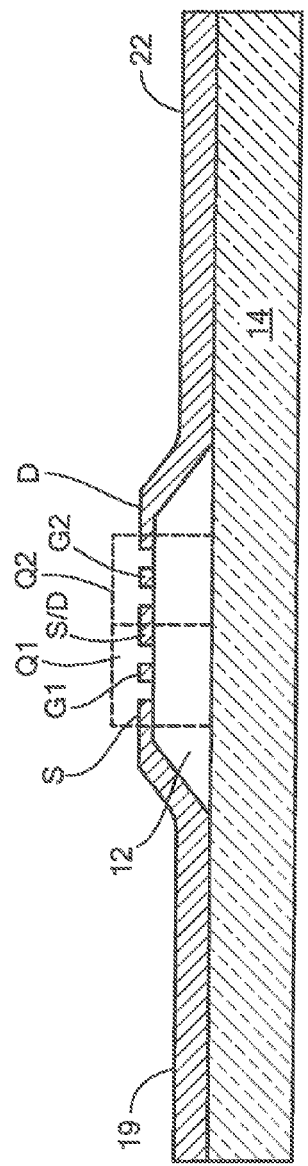
Figure 3D:
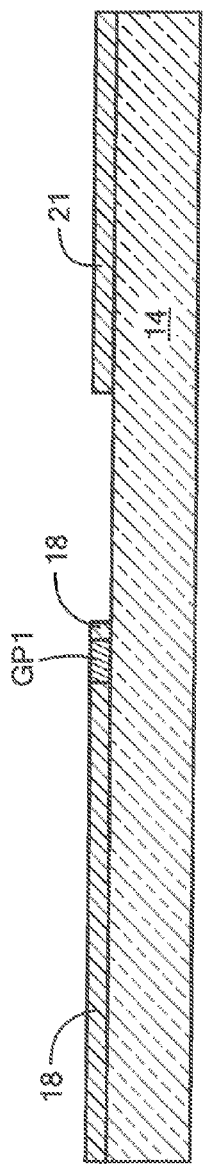

More particularly, the cascode transistor circuit 10 includes a substrate 14; an input transmission line 16 having a conductor 18 disposed on an upper surface of the substrate 14; an output transmission line 20 having a conductor 22 disposed on the upper surface of the substrate 14; a first transistor Q1 having the gate electrode (G1) disposed on the upper surface of the active region 12 and connected to the conductor 18 of the input transmission line 16, for controlling a flow of carriers, in a first portion of an active region 12 between a source region (S) of the active region 12 and a floating source/drain region (S/D) of the active region 12; a second transistor Q2 having the gate electrode (G2) disposed on the upper surface of the active region 12 for controlling a flow of carriers in the active region 12 between the floating source/drain region (S/D) of the active region 12 and a drain region (D) of the active region 12, the drain region (D) being connected to the conductor 22 of the output transmission line 20; the first gate contact pad (GP1), laterally displaced from the active region 12 (off of the mesa), and connected to one end of the gate electrode (G1) of the first transistor (Q1); the second gate contact pad (GP2), laterally displaced from the active region 12 (off of the mesa), and connected to one end of the gate electrode (G2) of the second transistor (Q2). As noted above, the first gate pad (GP1) and the second gate pad (GP2) are disposed on opposite sides of the active region mesa 12; here the first gate pad GP1 being shown in FIG. 3 below the mesa active region 12 and the second gate pad (GP2) being on the top side of the active region mesa 12. A capacitor 24 is included having: a lower plate 26 disposed on the upper surface of the substrate 14; a dielectric 28 disposed on the lower plate 26; and an upper plate 30 disposed on the dielectric 28, as shown more clearly in FIG. 3A. Here, for example, the mesa or active region 12 is a III-V semiconductor, such as, Gallium Nitride (GaN).

More particularly, the input transmission line 16, in this example, is a coplanar waveguide (CPW) transmission line having a center conductor, here conductor 18 disposed between a pair of ground plane conductor portions 19, 21 disposed on the upper surface of the substrate 14. The output transmission line, 20, in this example, is also a coplanar waveguide (CPW) transmission line having a center conductor, here conductor 22, disposed between a pair of ground plane conductor portions 21, 23, as shown, output CPW transmission line 20 being disposed on the upper surface of the substrate 14, as shown.

It is noted that the first transistor Q1 has the gate electrode (G1) thereof connected to the center conductor 18 of the input CPW transmission line 16 through the first gate pad (GP1) and the second transistor Q2 has the drain electrode (D) thereof connected to the center conductor 22 of the output CPW transmission line 20 through the drain pad (D), as shown.

It is also noted that the second gate pad (GP2) is connected to the bottom plate 26 of the capacitor 24 and the top plate 30 of the capacitor 24 is connected to the ground plates 19 and 23 with air-bridges 34, 32, as shown. It should also be noted that the gate electrode (G1) of the first transistor (Q1) extends laterally from the first gate contact pad (GP1) over the active region 12 along a first direction (in FIG. 3 an up-down direction); the gate electrode (G2) of the second transistor (Q2) extends laterally from the second gate contact pad (GP2) over the active region 12 parallel to the first direction; the conductors 32, 34 for connecting the upper plate 30 to the ground plane conductor portions 19, 23 of the input CPW transmission line 16 and the output CPW transmission line 20, respectively, extend along a direction perpendicular to the first direction (the right to left direction in FIG. 3).

Figure 1A:
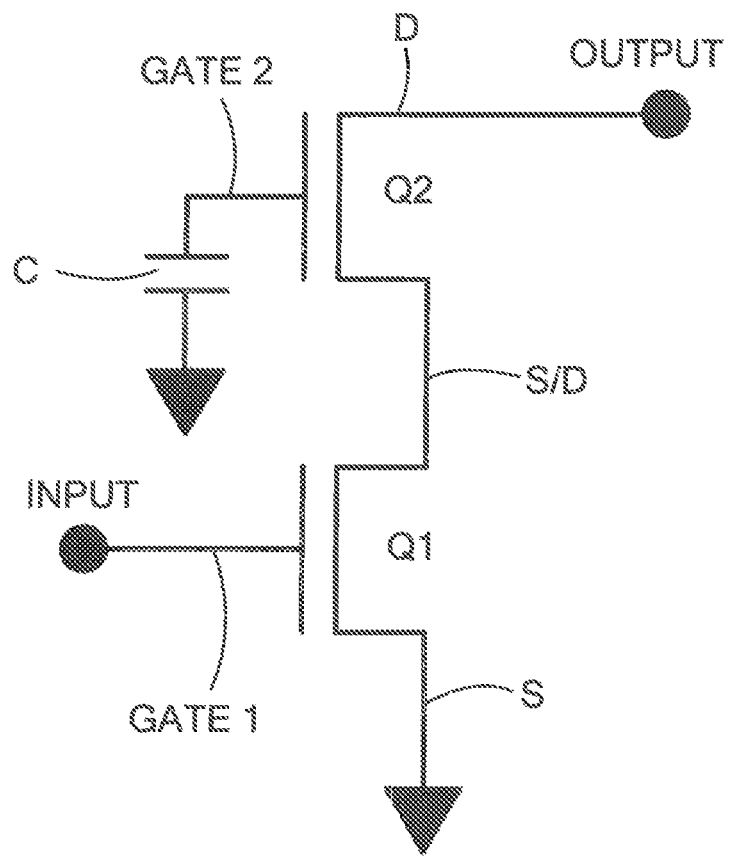
FIGS. 1A and 1B are a schematic diagram of a cascode transistor circuit and a plan view Monolithic Microwave Integrated Circuit (MMIC) layout of the cascode transistor circuit of FIG. 1A, respectively, according to the PRIOR ART.
Figure 1B:
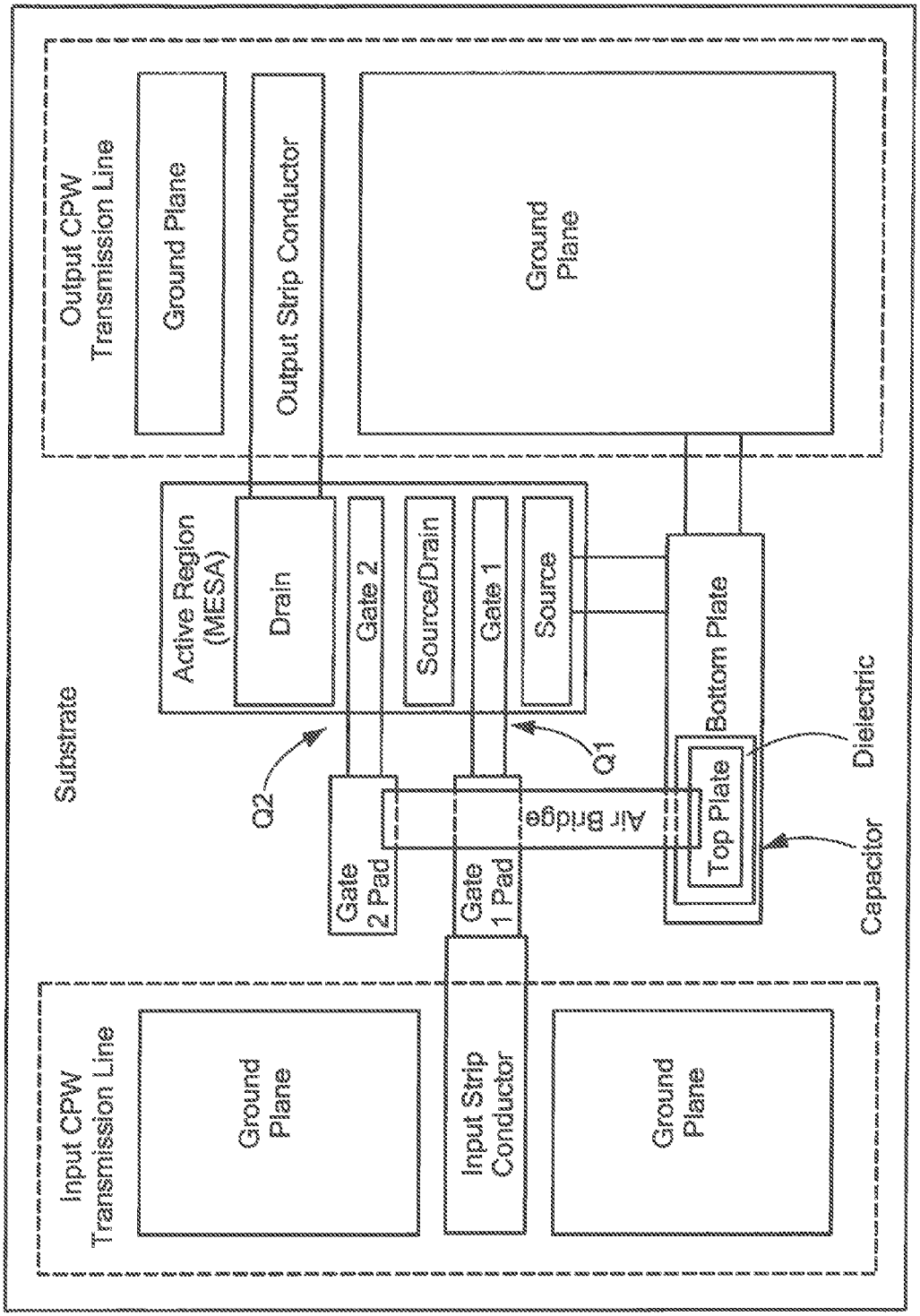

It is noted that the electrical path between the second gate pad (GP2) and ground in FIG. 3 is shorter compared with the layout of FIG. 1B because both gate pads (GATE PAD 1 and GATE PAD 2) are on the opposing sides of the active region and thus the relatively long air bridge of FIG. 1B is no longer required to "jump-over" or bridge the first gate pad (GATE PAD 1).

Figure 4:
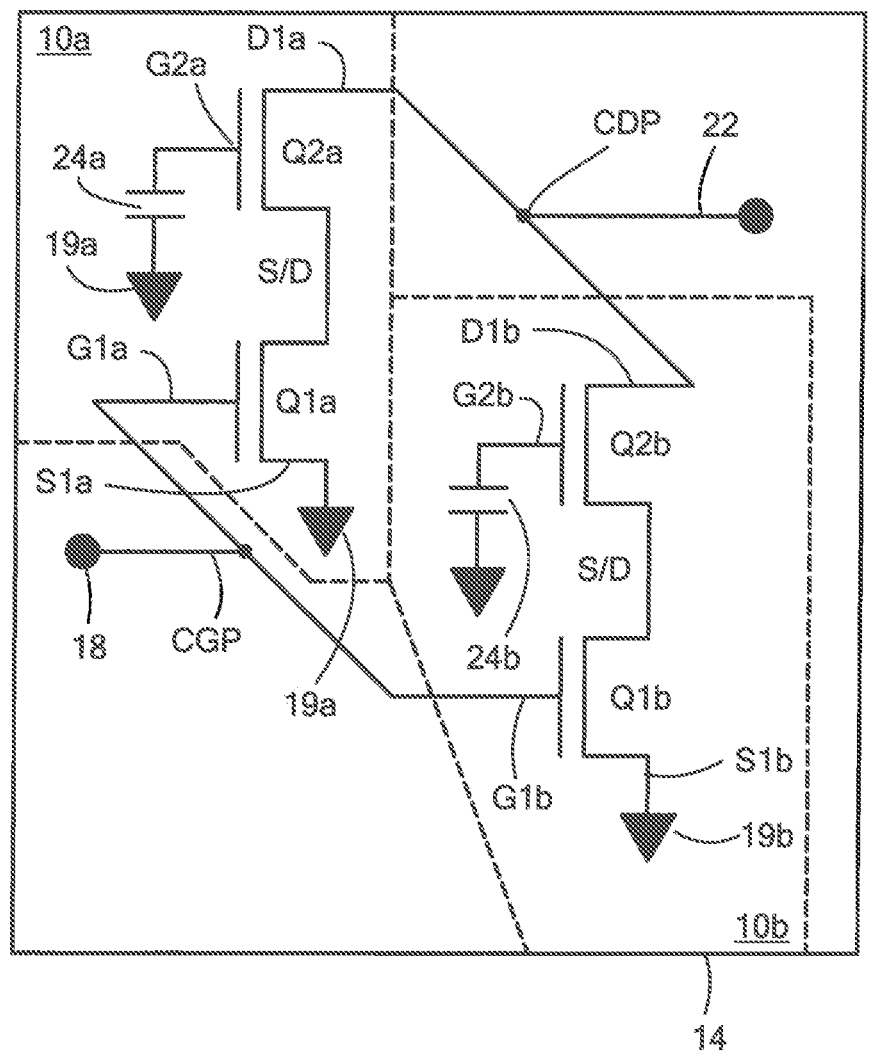
FIG. 4 is a is a schematic diagram of a pair of cascode transistor circuits according to the PRIOR ART.
Figure 5:
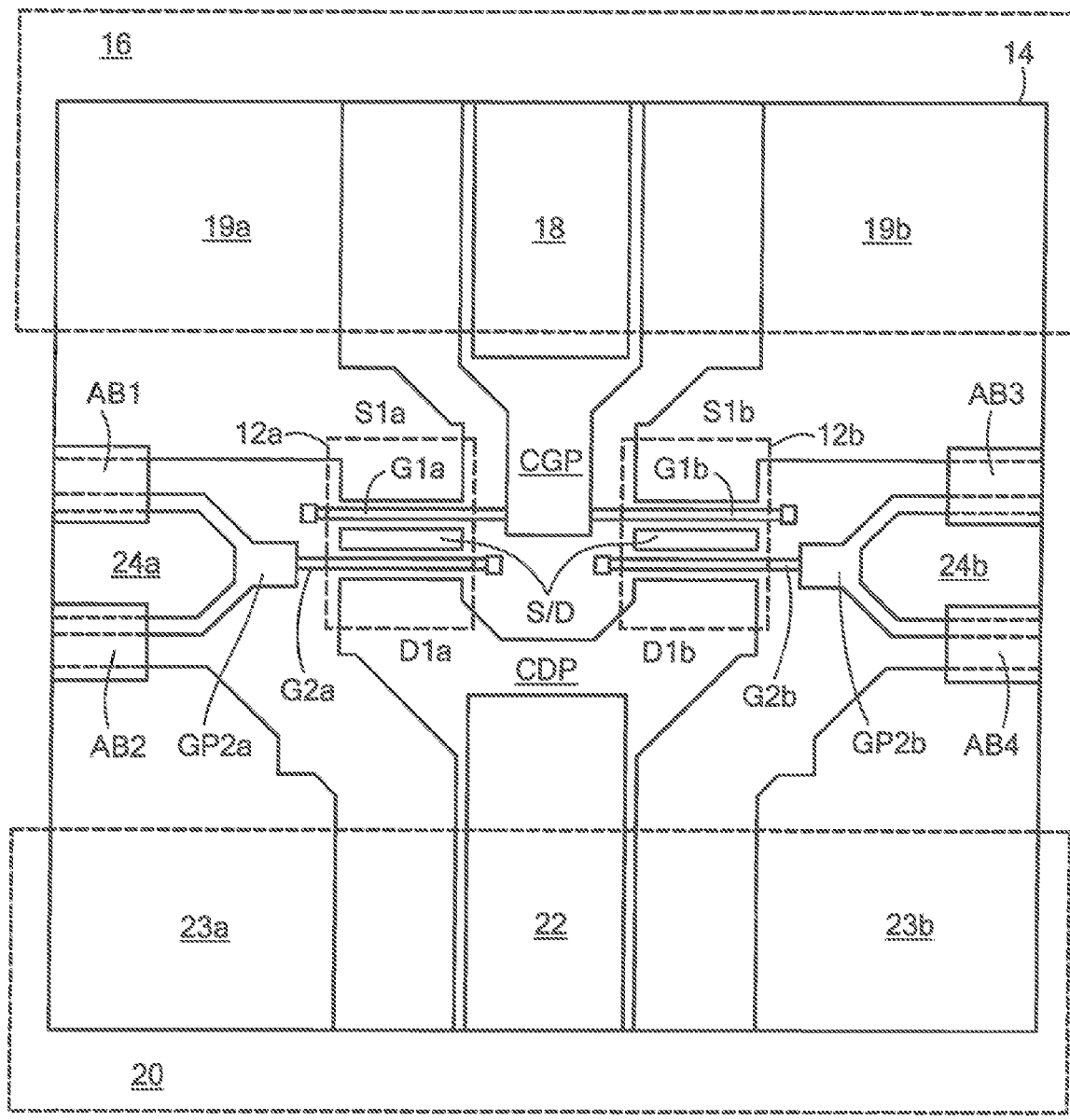
FIG. 5 is a plan view of a top view Monolithic Microwave Integrated Circuit (MMIC) layout of a pair of cascode transistor circuits of FIG. 4 according to another embodiment of the disclosure.

Referring now to FIGS. 4 and 5, a schematic diagram of a pair of cascode circuits 10a, 10b and an MMIC plan view layout of the circuit arrangement are shown, respectively. Here, the cascode transistor circuit arrangement is shown having: a pair of laterally spaced cascode transistor circuits 10a, 10b (FIG. 5), each circuit 10a, 10b having a pair of transistors Q1a, Q2a, and Q1b, Q2b, respectively as indicated in FIG. 4, each one of the circuits 10a, 10b having a corresponding one of a pair of active regions 12a, 12b (FIG. 5), each one of the pair of active regions 12a, 12b, being disposed on different portion of a surface of a substrate 14 as shown in FIG. 5. Each one of the active regions 12a, 12b, has a source (S1a for Q1a and S1b for Q1b), a drain (D1a for Q2a and D1b for Q2b), a floating source/drain (S/D), a first gate (G1a for Q1a and G1b for Q1b) disposed between the source (S1a of Q1a and S1b for Q1b) and the floating source/drain (S/D) and a second gate (G2a for Q2a and G2b for Q2b) disposed between the floating source/drain (S/D) and the drain (D1a for Q2a and D1b for Q2b); a common gate pad (COP) connected to the first gates (G1a and G1b) of both the cascode transistor circuits 10a, 10b and displaced from the active regions 12a, 12b and between the pair of laterally spaced active regions 12a, 12b; a first, second gate pad (GP2a) displaced from a first one of the active regions 12a and electrically connected to the second gate (G2a) of a first one of the pair of cascode connected transistors Q2a; a second, second gate pad (GP2b) displaced from a second one of the active regions 12b and electrically connected to the second gate (G2b) of a second one of the pair of cascode connected transistors Q2b. The common gate pad (CGP) and the first, second gate pad (GP2a) are on opposite sides of the first one of the active regions 12a and the common gate pad (COP) and the second, second gate pad (GP2b) are on opposite sides of the second one of the active regions 12b. Also included is a common drain pad (CDP) connected to the drains (D1a, D1b) of each one of the pair of cascode connected transistors Q2a, Q2b in circuits 10a, 10b.

A pair of capacitors 24a, 24b is provided; a bottom plate of capacitor 24a is connected to the first, second gate (GP2a) of gate (G2a) of the transistor circuit 10a and the bottom plate of capacitor 24b is connected to the second, second gate pad (GP2b) for the gate (G2b) of transistor circuit 10b. The top plate of capacitor 24a is connected to ground plane conductors 19a and 23a of the input and output CPW transmission lines 16, 20 by air bridges AB1, and AB2 and the top plate of capacitor 24b is connected to ground plane conductors 19b, 23b of the input and output CPW transmission lines 16, 20 by air bridges AB3 and AB4. It is noted that the ground plane 21 (FIG. 3) is separated into two portions 19a and 23a.

Figure 2A:
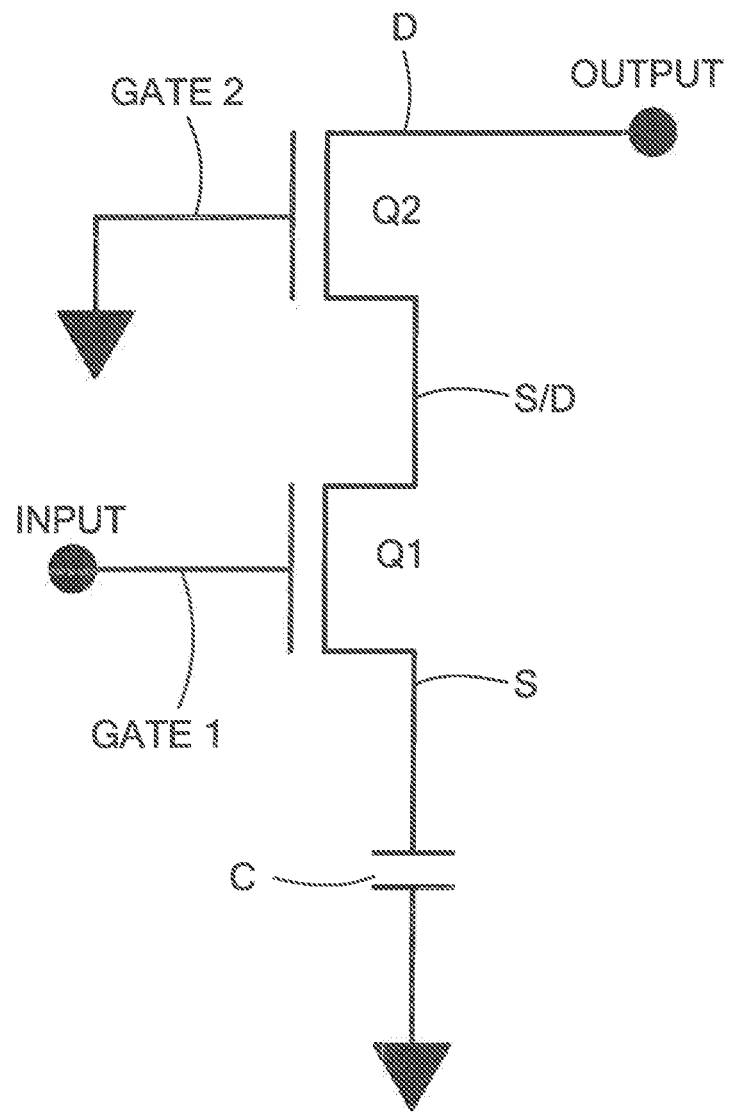
FIGS. 2A and 2B area schematic diagram of another cascode transistor circuit and is a plan view of a top view Monolithic Microwave Integrated Circuit (MMIC) layout of the cascode transistor circuit of FIG. 2A, respectively, according to the PRIOR ART.
Figure 2B:
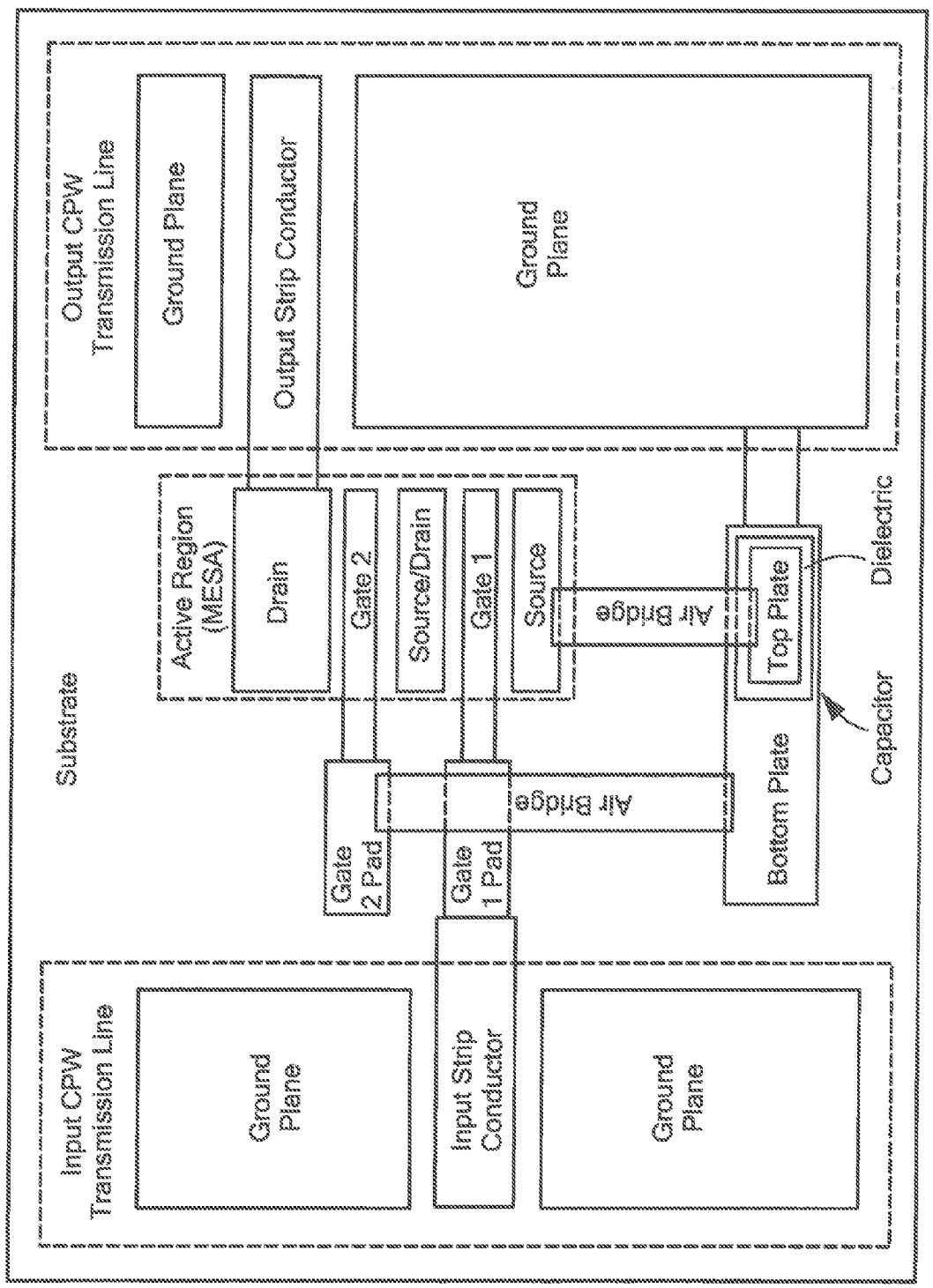
Figure 6:
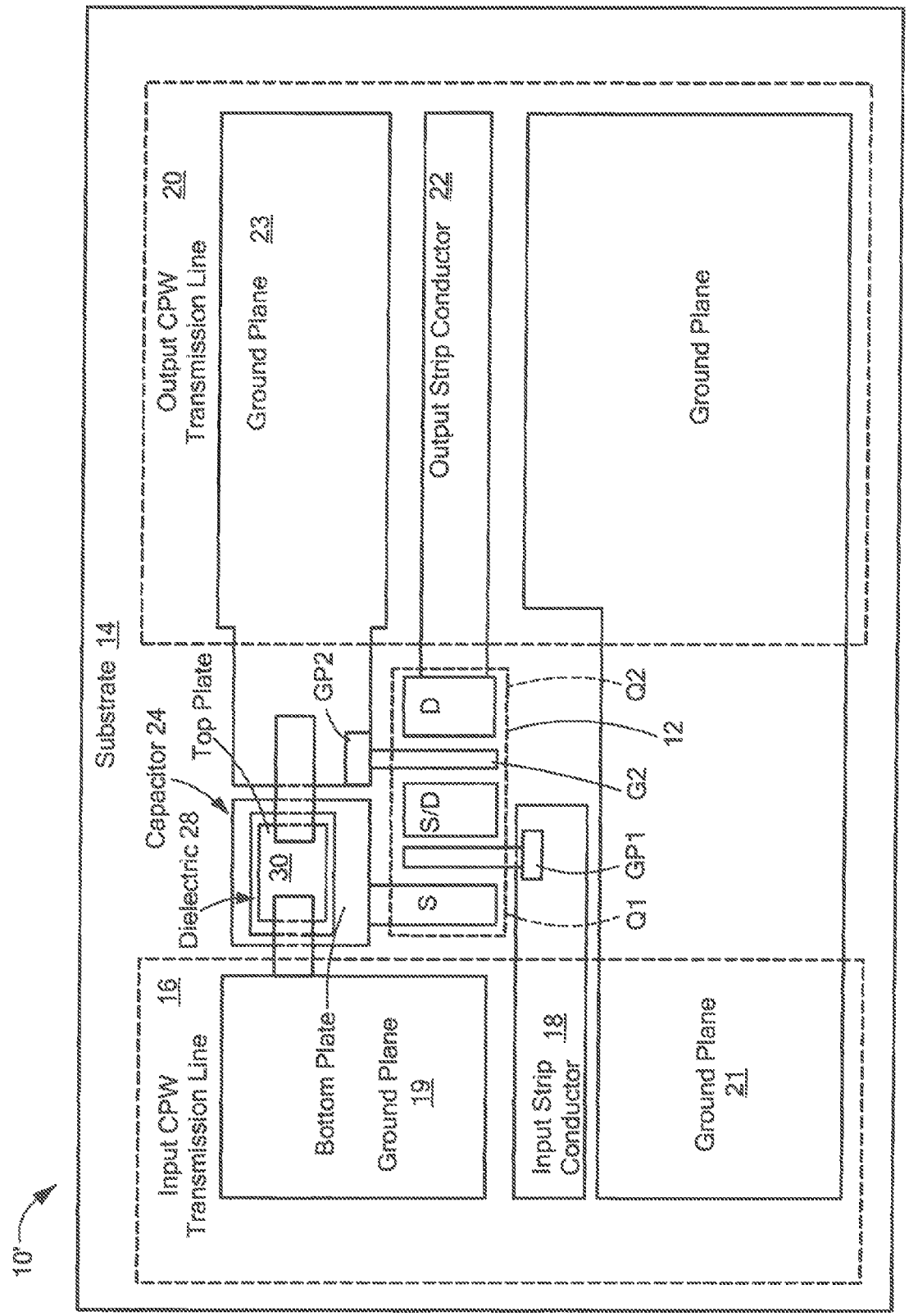
FIG. 6 is a plan view of a top view Monolithic Microwave Integrated Circuit (MMIC) layout of a cascode transistor circuit of FIG. 2A according to still another embodiment of the disclosure.

FIG. 2B is a plan view of a top view Monolithic Microwave Integrated Circuit (MMIC) layout of a cascode transistor circuit of FIG. 2A according to the PRIOR ART and FIG. 6 is a plan view of a top view Monolithic Microwave Integrated Circuit (MMIC) 10' layout of a cascode transistor circuit of FIG. 2A according to the disclosure. Here again it is noted that the electrical path between the second gate pad (GP2) and ground is shorter compared with the layout of FIG. 2B, because both gate pads (GATE PAD 1 and GATE PAD 2) are on opposing sides of the active region and thus the relatively long air bridge of FIG. 2B is no longer required to "jump-over" or bridge the first gate pad (GATE PAD 1).

A number of embodiments of the disclosure have been described. Nevertheless, it will be understood that various modifications may be made without departing from the spirit and scope of the disclosure. For example, the dielectric of the capacitor may extend over the bottom conductor eliminating the need for an air bridge type conductor. Also, other transmission lines than CPW may be used such as microstrip transmission line wherein the ground plane is on the bottom surface of the substrate. Further, with the CPW transmission lines, a ground plane may be formed on the bottom surface of the substrate and may be connected to the CPW transmission line ground planes with conductive vias passing vertically though the substrate. Still further other semiconductor materials may be used in place of GaN. Still further, the active region need not be a mesa but merely a semiconductor region wherein carriers pass and are controlled by the gate. Accordingly, other embodiments are within the scope of the following claims.

What is claimed is:

1. A cascode transistor circuit, comprising:
an active region having a source, a drain, a floating source/drain;
a first gate disposed between the source and the floating source/drain;
a second gate disposed between the floating source/-drain and the drain;
a first gate pad displaced from the active region and electrically connected to the first gate;

a second gate pad displaced from the active region and electrically connected to the second gate; and wherein the first and the second gate pads are disposed on opposite sides of the active region.

2. The cascode transistor circuit recited in claim 1 including a capacitor connected between one of the source or the second gate pad and ground.

3. A cascode transistor circuit, comprising:
a substrate;
an input transmission line having a conductor disposed on an upper surface of the substrate;
an output transmission line having a conductor disposed on the upper surface of the substrate;
a first transistor having a gate electrode disposed on the upper surface of the substrate and connected to the conductor of the input transmission line, for controlling a flow of carriers, in a first portion of an active region of the substrate, between a source region of the substrate and a floating source/drain region of the substrate;
a second transistor having a gate electrode disposed on the upper surface of the substrate for controlling a flow of carriers in an active region of the substrate between the floating source/drain region of the substrate and a drain region of the substrate, the drain region being connected to the conductor of the output transmission line;
a first gate contact pad, laterally displaced from the active region, and connected to one end of the gate electrode of the first transistor;
a second gate contact pad, laterally displaced from the active region, and connected to one end of the gate electrode of the second transistor; and
wherein the first gate contact pad and the second gate contact pad are disposed on opposite sides of the active region;
a capacitor, comprising:
a lower plate disposed on the upper surface of the substrate;
a dielectric disposed on the lower plate; and
an upper plate disposed on the dielectric; and
wherein one of the upper and lower plates is connected to one of the source or second gate contact pad and the other one of the upper plate and lower plates is connected to the ground plane conductor portions of at least one of the input transmission line or the output transmission line.

4. The cascode transistor circuit recited in claim 3 wherein the lower plate is connected to one of the source or the second gate contact pad and the upper plate is connected to the ground plane conductor portions of at least one of the input transmission line or the output transmission line.

5. A cascode transistor circuit, comprising:
a substrate;
an input coplanar waveguide (CPW) transmission line having a center conductor disposed between a pair of ground plane conductor portions, the input CPW transmission line being disposed on a surface of the substrate;
an output coplanar waveguide (CPW) transmission line having a center conductor disposed between a pair of ground plane conductor portions, the output CPW transmission line being disposed on the surface of the substrate;
a first transistor having a gate electrode disposed on the surface of the substrate and connected to the center conductor of the input CPW transmission line, for controlling a flow of carriers, in a first portion of an active region of the substrate, between a source region of the substrate and a floating source/drain region of the substrate;
a second transistor having a gate electrode disposed on a surface of the substrate for controlling a flow of carriers in an active region of the substrate between the floating source/drain region of the substrate and a drain region of the substrate, the drain region being connected to the center conductor of the output CPW transmission line;
a first gate contact pad, laterally displaced from the active region, and connected to one end of the gate electrode of the first transistor;
a second gate contact pad, laterally displaced from the active region, and connected to one end of the gate electrode of the second transistor; and
wherein the first gate pad and the second gate pad are disposed on opposite sides of the active region;
a capacitor, comprising:
a lower plate disposed on the surface of the substrate;
a dielectric disposed on the lower plate; and
an upper plate disposed on the dielectric; and
wherein the lower plate is connected to one of the source or the second gate pad and the upper plate is connected to the ground plane conductor portions of at least one of the input CPW transmission line or the output CPW transmission line.

6. The cascode transistor circuit recited in claim 5 wherein:
the gate electrode of the first transistor extending laterally from the first gate contact pad over the active region portion along a first direction;
the gate electrode of the second transistor extending laterally from the second gate contact pad over the active region portion parallel to the first direction;
including a conductor for connecting the upper plate to the ground plane conductor portions of at least one of the input CPW transmission line or the output CPW transmission line, the conductor extending along a direction perpendicular to the first direction.

7. The cascode transistor circuit recited in claim 6 wherein the conductor is an air-bridge conductor.

* * * * *